(12) United States Patent
Lee et al.

(10) Patent No.: US 12,094,764 B2
(45) Date of Patent: Sep. 17, 2024

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Taipei (TW); Hsiao-Kang Chang, Hsinchu (TW); Ting-Ya Lo, Hsinchu (TW); Chi-Lin Teng, Taichung (TW); Cherng-Shiaw Tsai, New Taipei (TW); Shao-Kuan Lee, Kaohsiung (TW); Kuang-Wei Yang, Hsinchu (TW); Hsin-Yen Huang, New Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 448 days.

(21) Appl. No.: 17/460,978

(22) Filed: Aug. 30, 2021

(65) Prior Publication Data
US 2023/0066861 A1   Mar. 2, 2023

(51) Int. Cl.
*H01L 23/48*   (2006.01)
*H01L 21/768*   (2006.01)
*H01L 23/522*   (2006.01)
*H01L 23/532*   (2006.01)

(52) U.S. Cl.
CPC .... *H01L 21/7682* (2013.01); *H01L 21/76834* (2013.01); *H01L 21/76837* (2013.01); *H01L 21/76885* (2013.01); *H01L 23/5226* (2013.01); *H01L 21/76843* (2013.01); *H01L 21/76852* (2013.01); *H01L 23/53295* (2013.01)

(58) Field of Classification Search
CPC ........... H01L 21/7682; H01L 21/76834; H01L 21/76852; H01L 23/5226; H01L 23/53295
USPC .................................................. 257/774, 522
See application file for complete search history.

(56) References Cited

U.S. PATENT DOCUMENTS

| | | | |
|---|---|---|---|
| 6,984,577 B1 * | 1/2006 | Zhao | H01L 23/53295 438/421 |
| 8,072,073 B2 * | 12/2011 | Kikuchi | H01L 23/5283 257/774 |
| 8,492,808 B2 * | 7/2013 | Omori | H01L 23/53238 438/653 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |

(Continued)

*Primary Examiner* — Nitin Parekh
(74) *Attorney, Agent, or Firm* — NZ CARR LAW OFFICE

(57) ABSTRACT

A method for forming an interconnect structure is described. In some embodiments, the method includes forming a conductive layer, removing portions of the conductive layer to form a via portion extending upward from a bottom portion, forming a sacrificial layer over the via portion and the bottom portion, recessing the sacrificial layer to a level substantially the same or below a level of a top surface of the bottom portion, forming a first dielectric material over the via portion, the bottom portion, and the sacrificial layer, and removing the sacrificial layer to form an air gap adjacent the bottom portion.

20 Claims, 21 Drawing Sheets

(56) References Cited

U.S. PATENT DOCUMENTS

| | | | |
|---|---|---|---|
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2002/0158337 A1* | 10/2002 | Babich | H01L 21/7681 |
| | | | 257/750 |
| 2003/0186535 A1* | 10/2003 | Wong | H01L 21/76807 |
| | | | 257/E21.589 |
| 2016/0284593 A1* | 9/2016 | Yang | H01L 23/53238 |
| 2016/0307793 A1* | 10/2016 | Huang | H01L 23/53209 |
| 2018/0005876 A1* | 1/2018 | Tung | H01L 23/53295 |
| 2018/0261546 A1* | 9/2018 | Bark | H01L 23/5226 |
| 2019/0221475 A1* | 7/2019 | Hong | H01L 21/76835 |
| 2020/0328155 A1* | 10/2020 | Schultz | H01L 21/7682 |
| 2021/0305087 A1* | 9/2021 | Parikh | H01L 21/32139 |
| 2022/0115266 A1* | 4/2022 | Huang | H01L 23/5222 |
| 2022/0199522 A1* | 6/2022 | Lee | H01L 21/823871 |
| 2023/0063438 A1* | 3/2023 | Lee | H01L 21/76826 |

\* cited by examiner

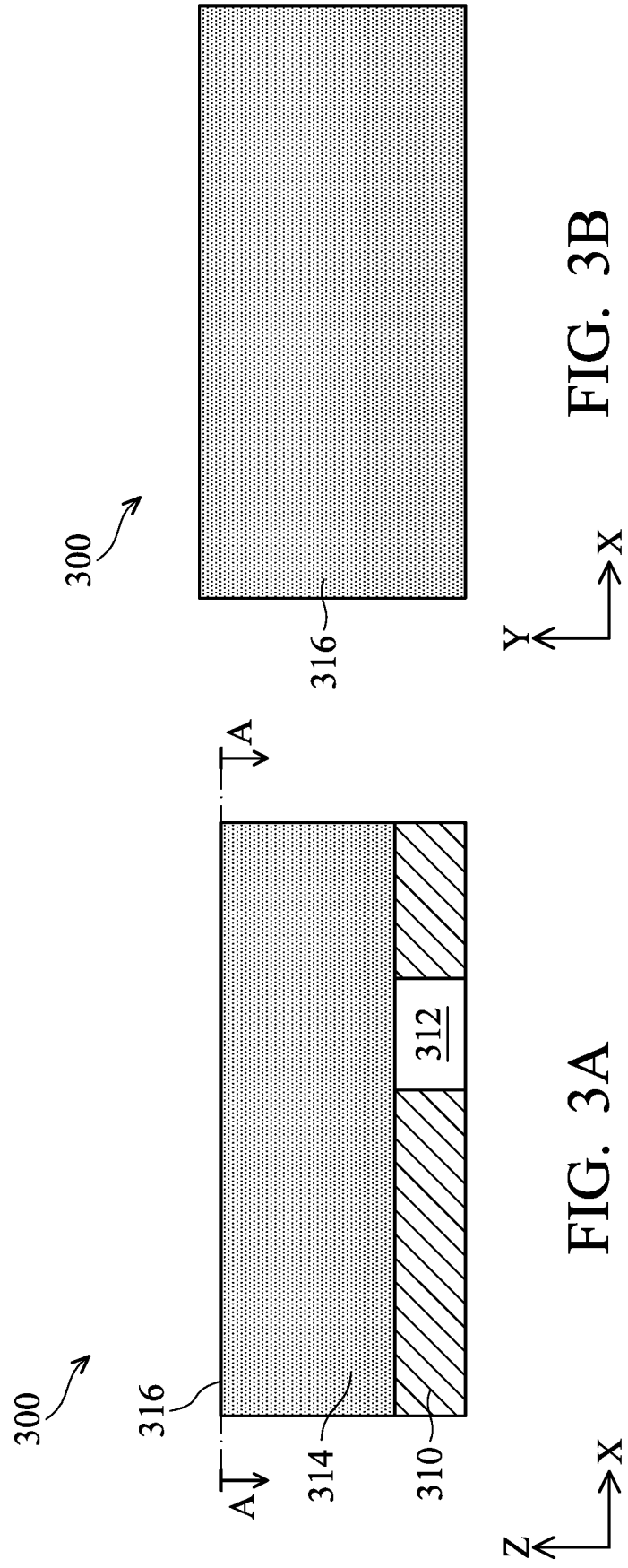

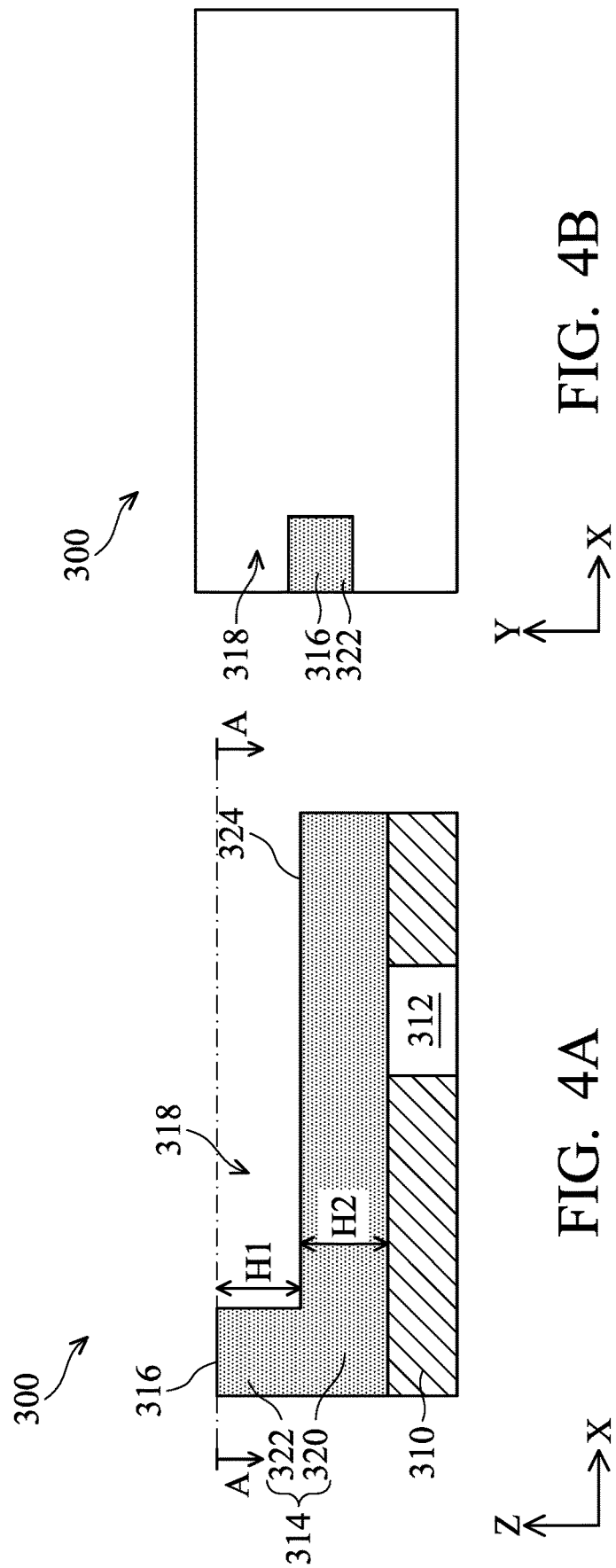

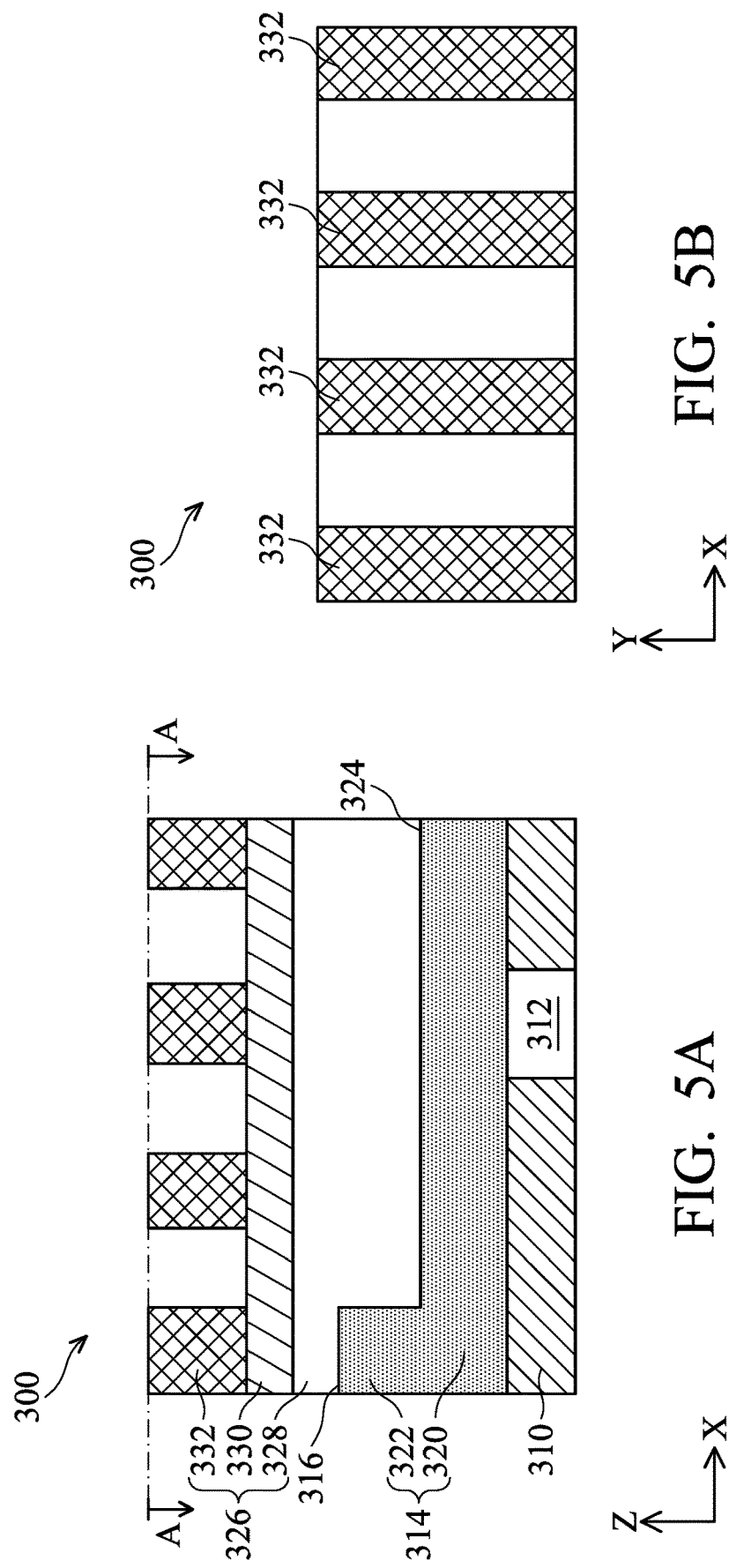

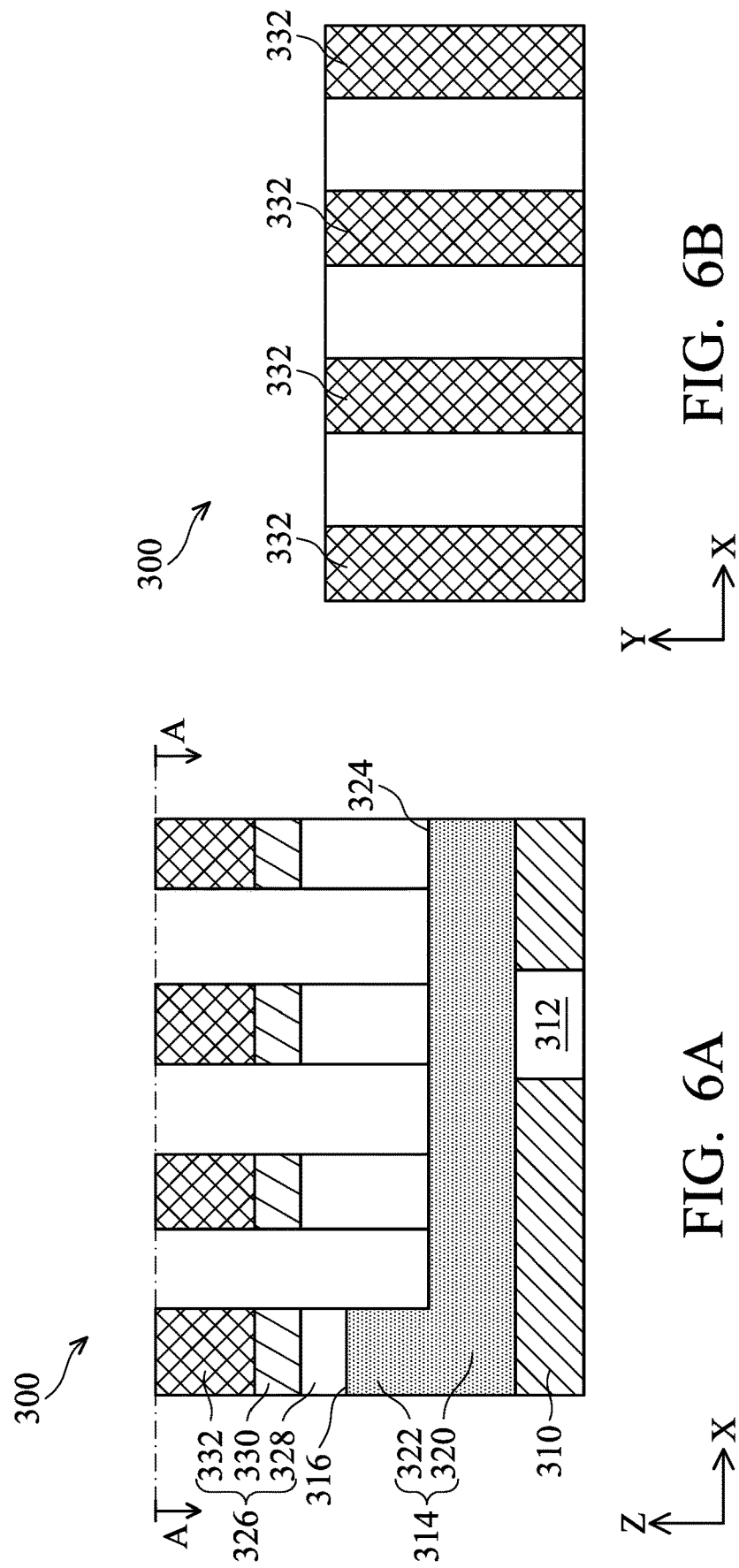

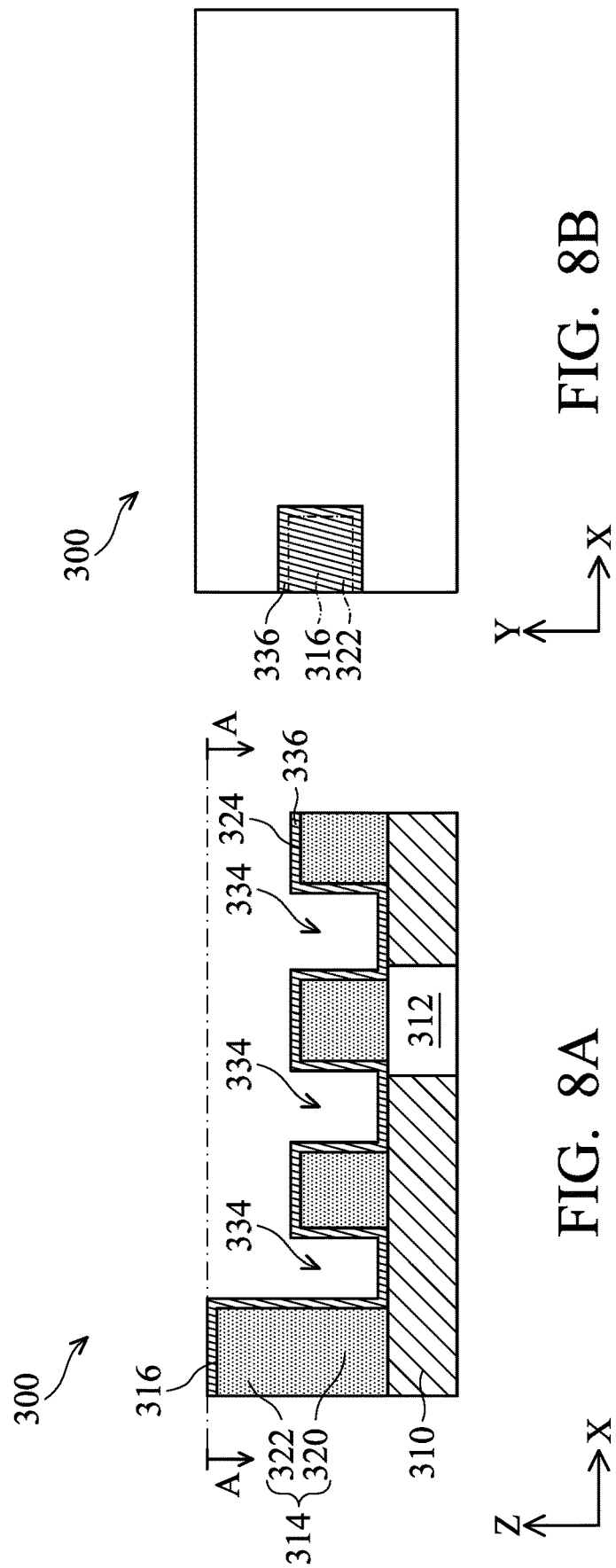

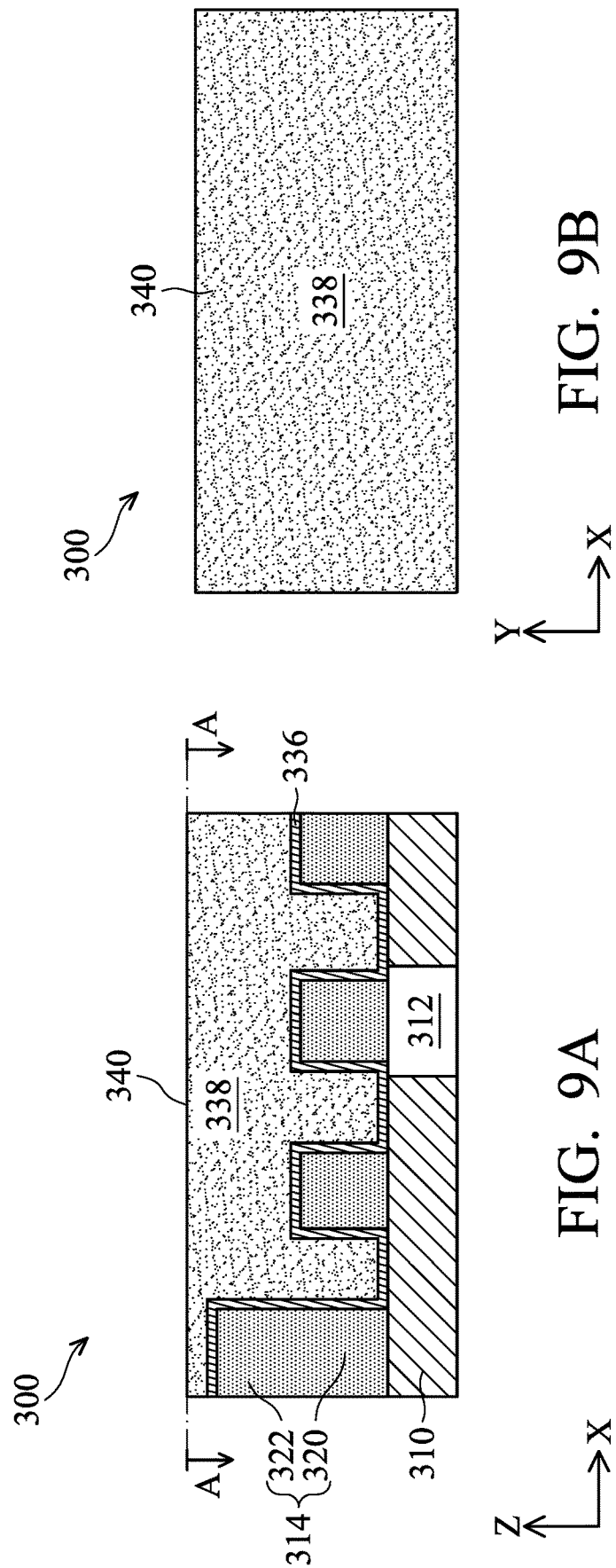

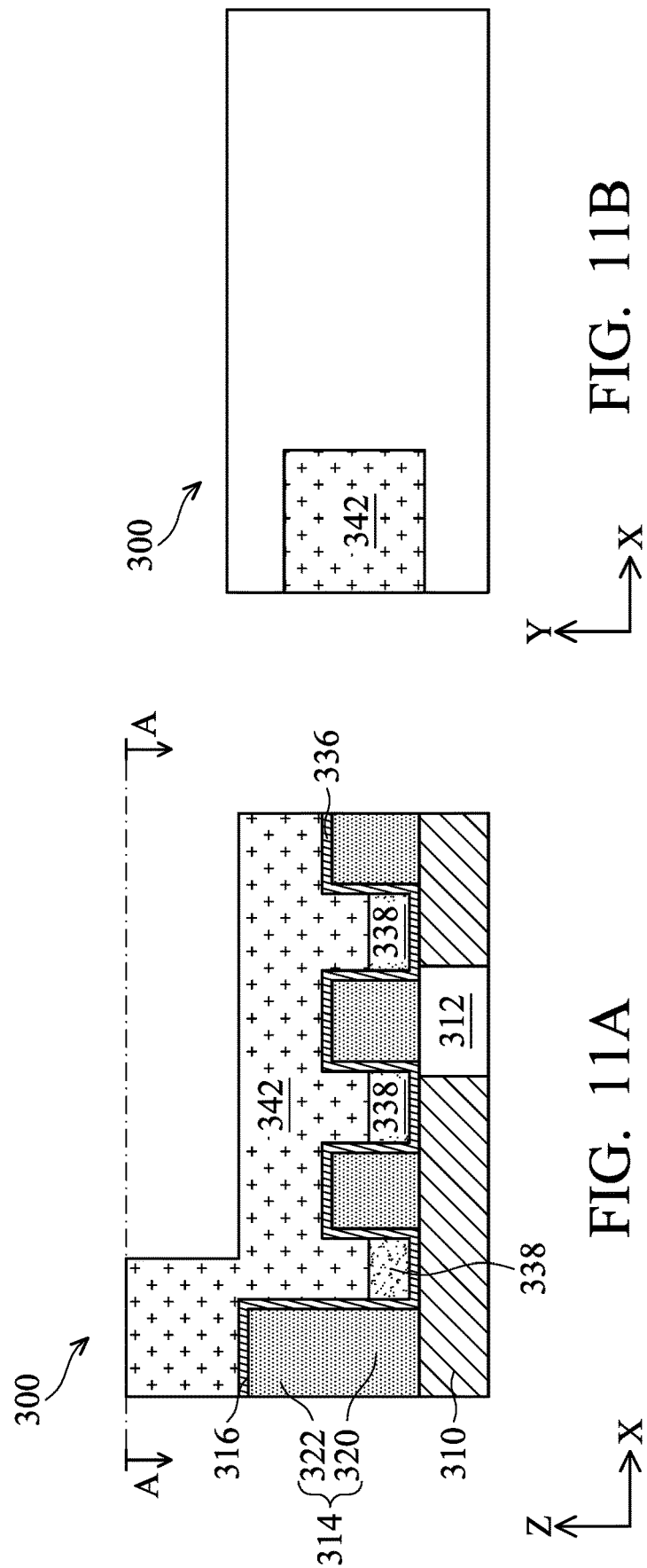

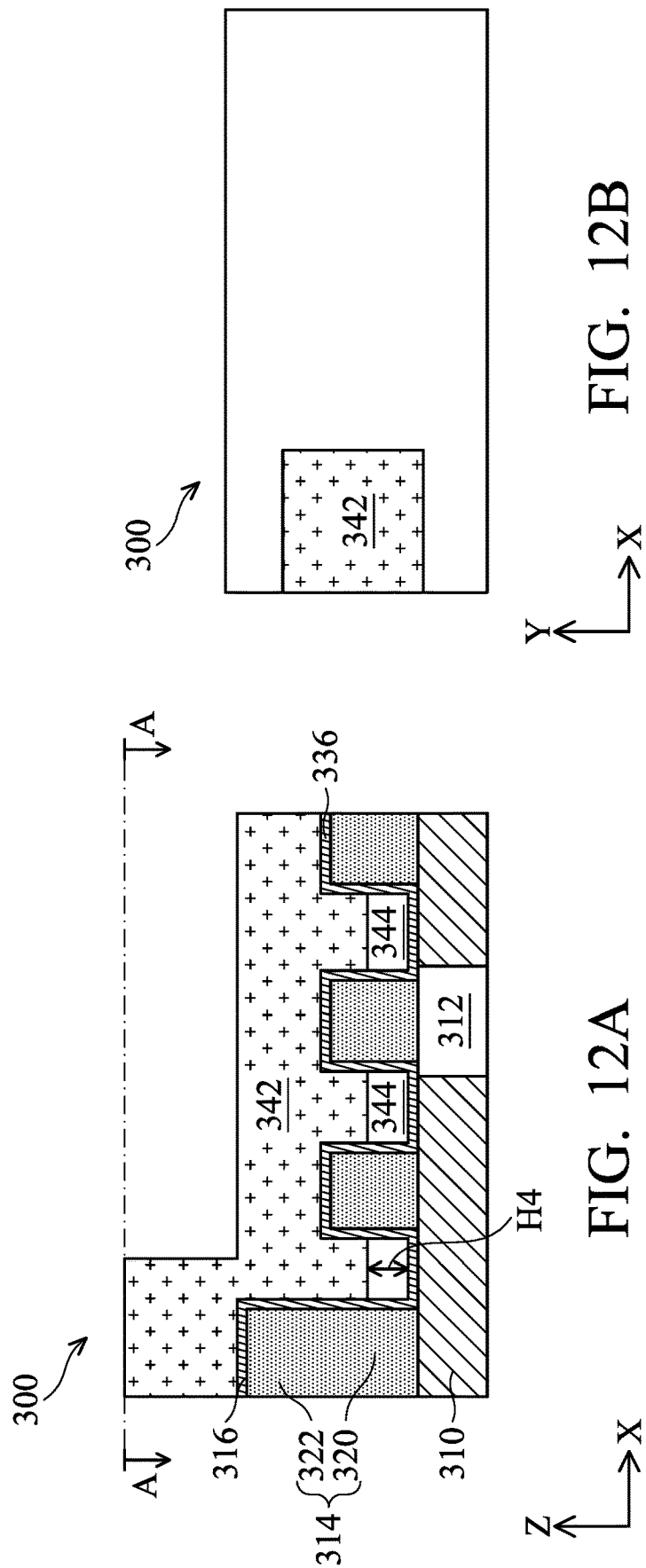

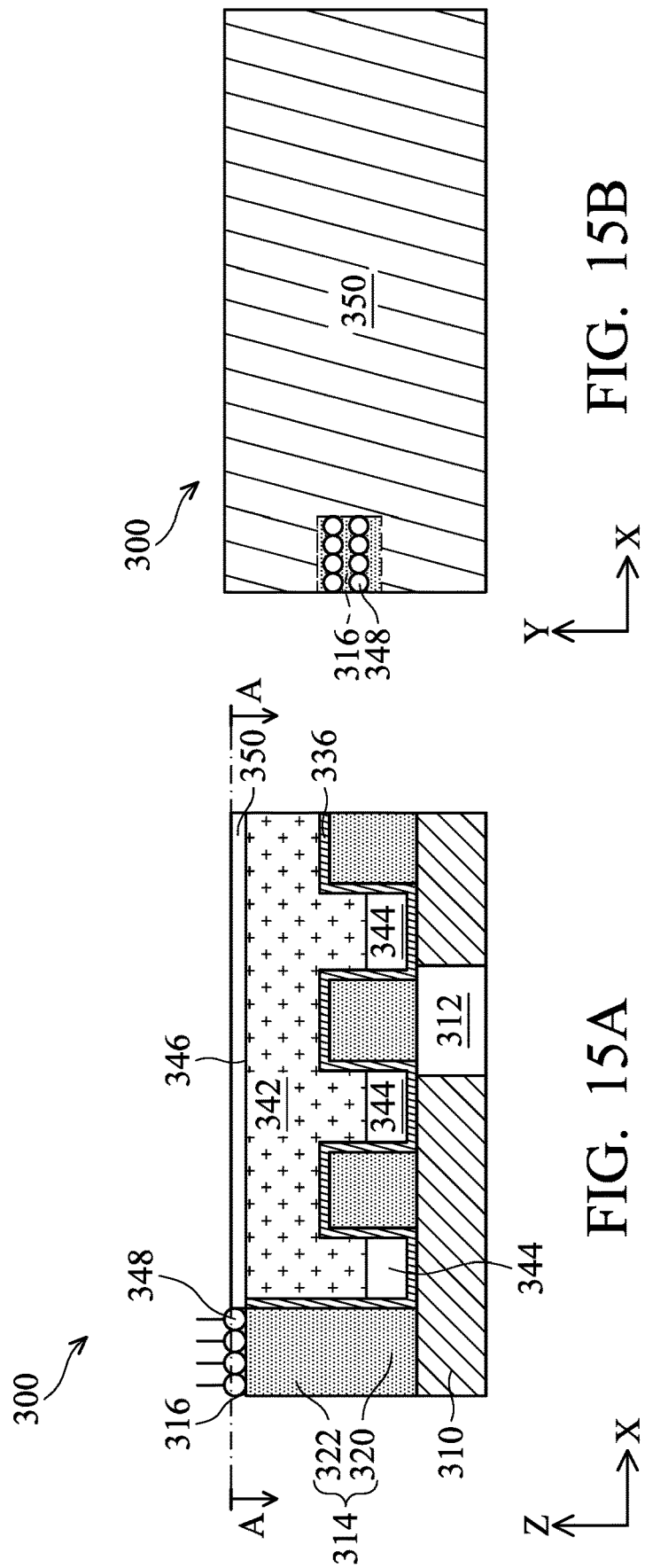

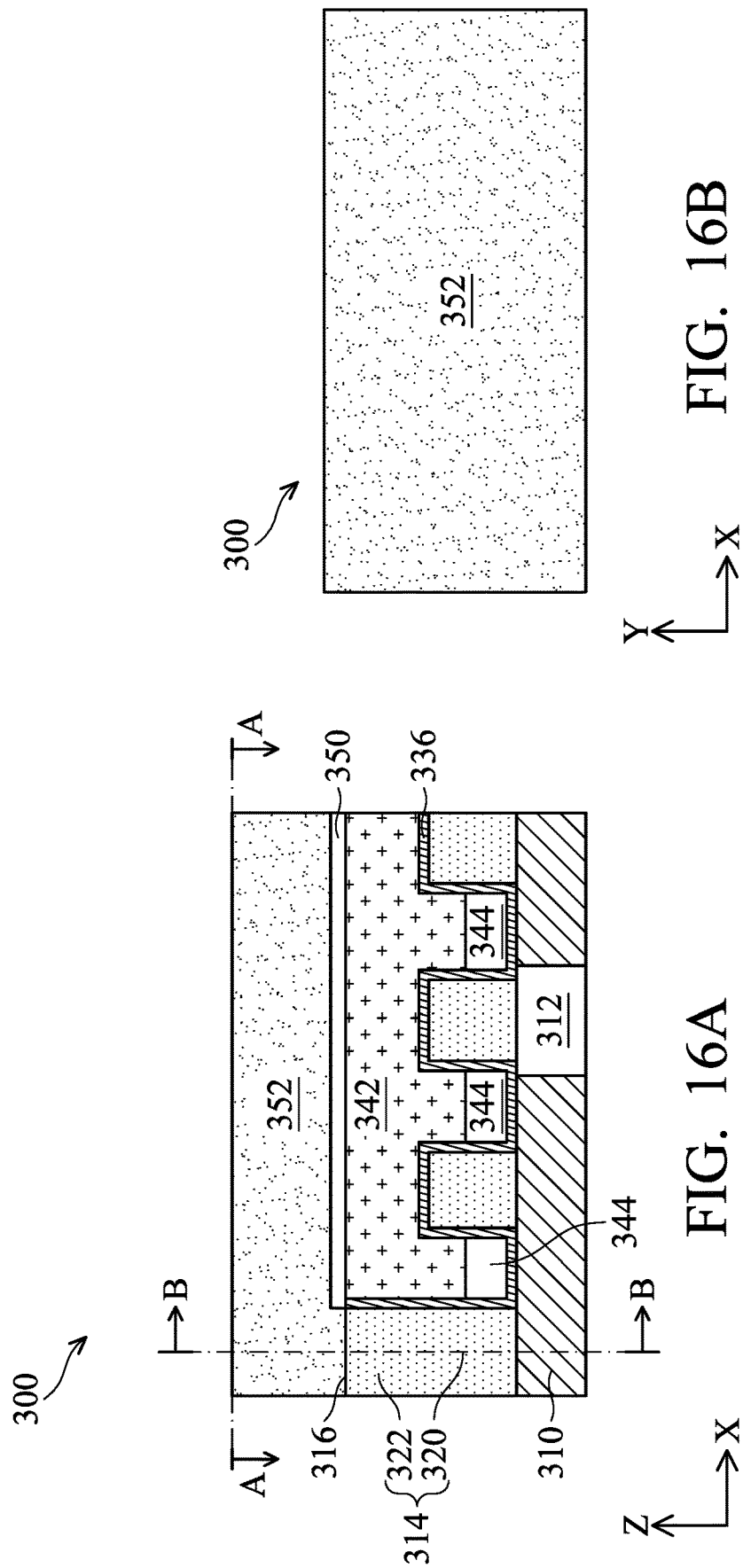

INTERCONNECT STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnect structure gets higher, electrical resistivity and resistive-capacitive (RC) delay increase. Therefore, improved methods of forming the interconnect structure are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-16A are cross-sectional side views of various stages of manufacturing an interconnect structure, in accordance with some embodiments.

FIGS. 3B-16B are top views of various stages of manufacturing the interconnect structure of FIGS. 3A-16A, respectively, in accordance with some embodiments.

DETAILED DESCRIPTION

Figure 1A:
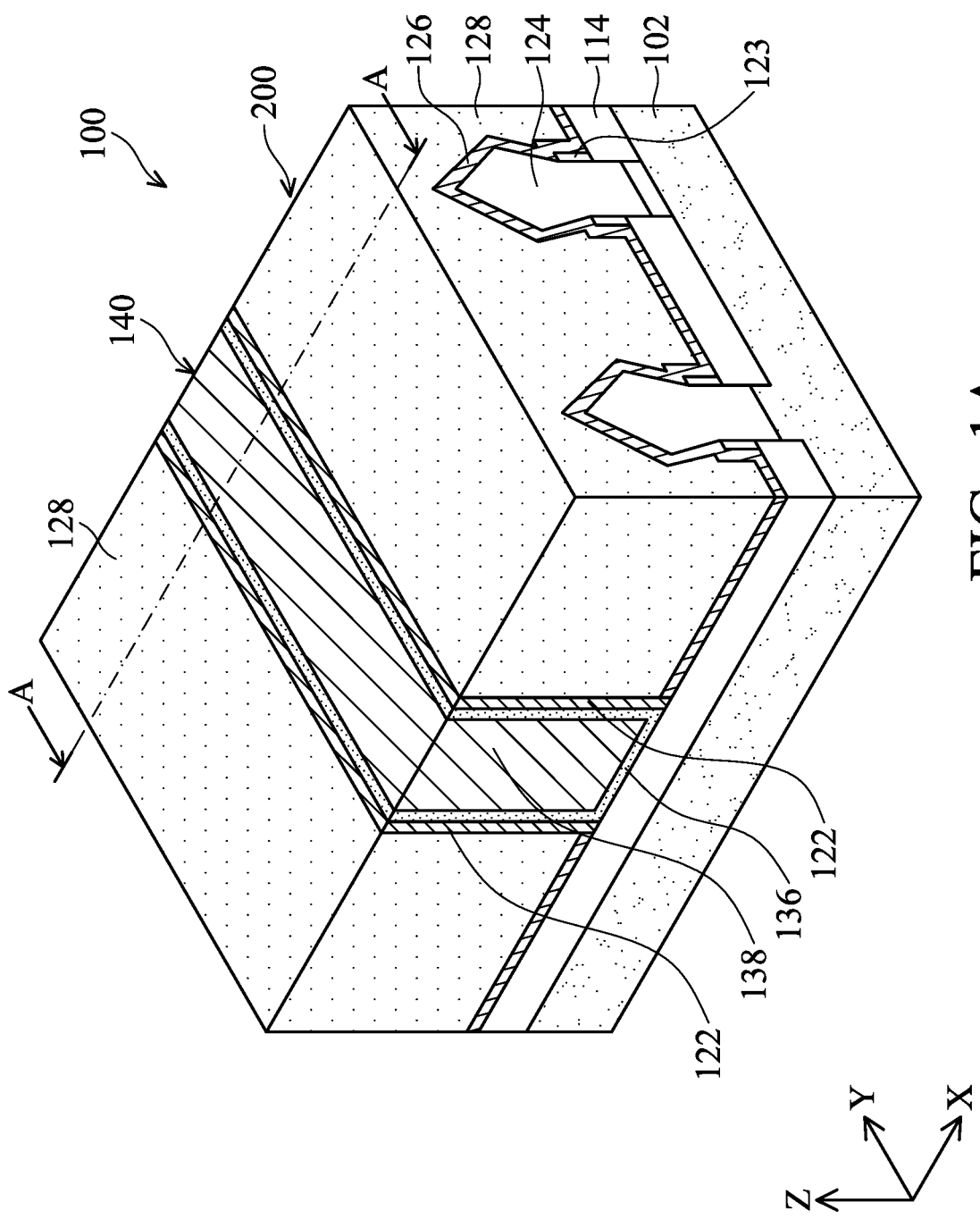
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
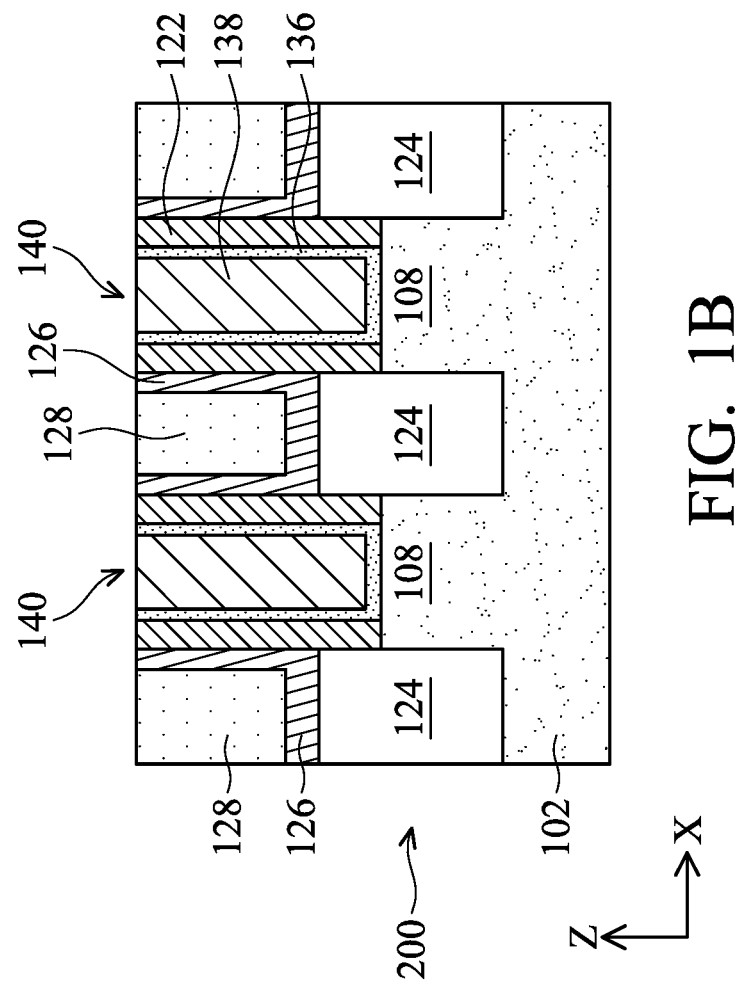
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136).

The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
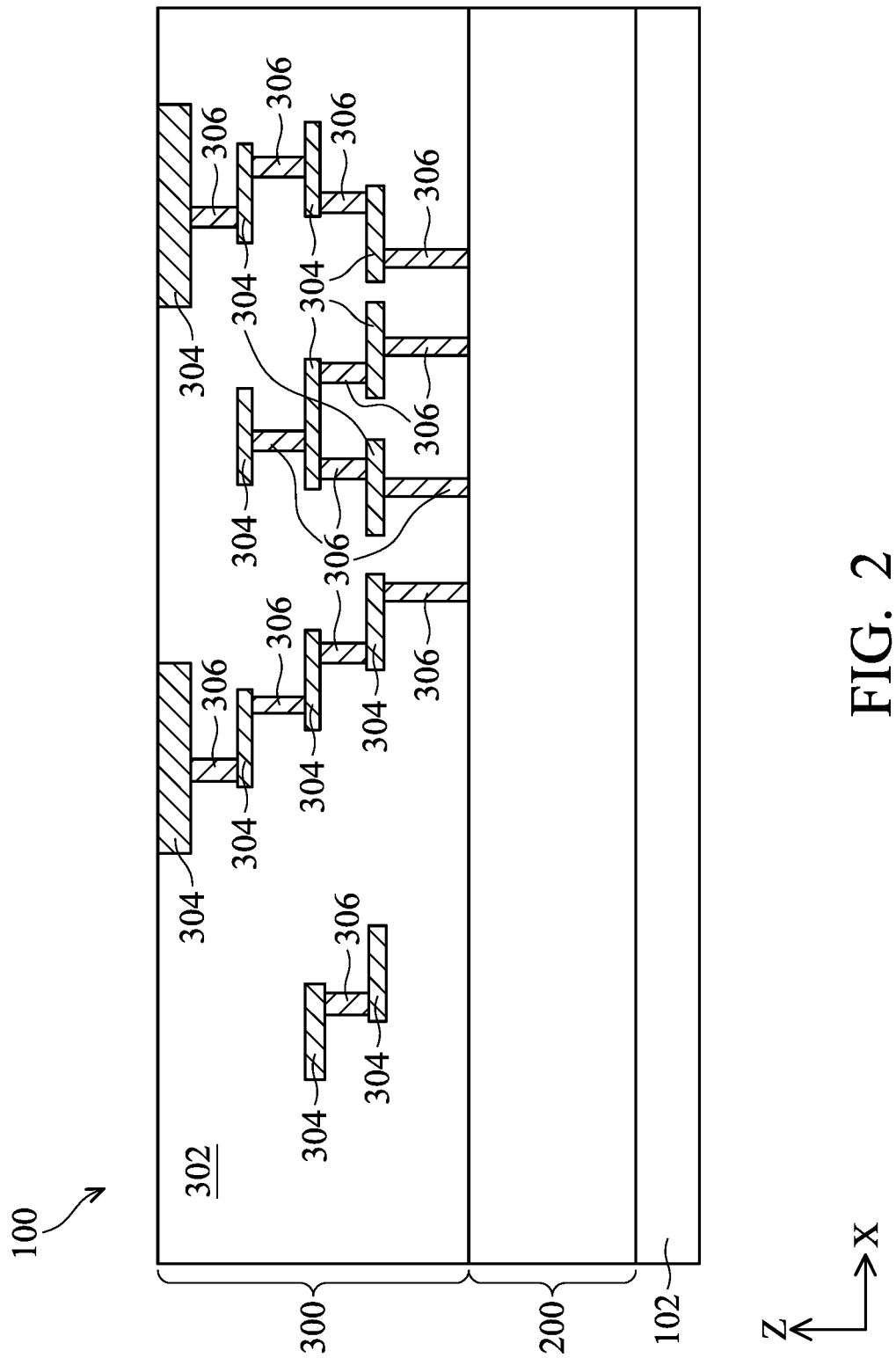
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottommost conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

FIGS. 3A-16A are cross-sectional side views of various stages of manufacturing the interconnect structure 300, in accordance with some embodiments. FIGS. 3B-16B are top views of various stages of manufacturing the interconnect structure 300 taken along line A-A of FIGS. 3A-16A, respectively, in accordance with some embodiments. The top views shown in FIGS. 3B-16B may only show materials located along the line A-A, while materials not located along the line A-A are not shown. In some figures, materials not located along the line A-A are shown using dotted lines to indicate being located at a different level along the z-axis. As shown in FIGS. 3A and 3B, the interconnect structure 300 includes a dielectric layer 310, which may be an ILD layer or an IMD layer. For example, the dielectric layer 310 may be the ILD layer 128 (FIGS. 1A and 1B) or the IMD layer 302 (FIG. 2). The dielectric layer 310 may include the same material as the ILD layer 128 or the IMD layer 302. In some embodiments, the dielectric layer 310 includes a low-k dielectric material, such as SiOCH. The dielectric layer 310 may be formed by CVD, FCVD, ALD, spin coating, or other suitable process. The dielectric layer 310 includes one or more conductive features 312 (only one is shown) disposed in the dielectric layer 310. The conductive feature 312 includes an electrically conductive material, such as Cu, Co, Ru, Mo, Cr, W, Mn, Rh, Ir, Ni, Pd, Pt, Ag, Au, Al, FeCo, FeAl, alloys thereof, or other suitable material. In some embodiments, the conductive feature 312 includes a metal. The conductive feature 312 may be formed by PVD, CVD, ALD, or other suitable process. In some embodiments, the conductive feature 312 may be the conductive contact disposed in the ILD layer 128 or the conductive feature 304 or 306 disposed in the IMD layer 302. In some embodiments, the conductive feature 312 includes a barrier layer (not shown) disposed between the dielectric layer 310 and the electrically conductive material of the conductive feature 312. The barrier layer may include an electrically conductive material, such as a metal or metal nitride.

A conductive layer 314 is disposed on the dielectric layer 310. The conductive layer 314 includes an electrically conductive material, such as Cu, Co, Ru, Mo, Cr, W, Mn, Rh, Ir, Ni, Pd, Pt, Ag, Au, Al, FeAl, FeCo, alloys thereof, or other suitable material. In some embodiments, the conductive layer 314 includes the same material as the conductive feature 312. The conductive layer 314 is formed by any suitable process, such as ECP, electroless deposition (ELD), PVD, or CVD. As shown in FIGS. 3A and 3B, the conductive layer 314 includes a substantially planar top surface 316.

As shown in FIGS. 4A and 4B, portions of the conductive layer 314 are removed to form an opening 318. In some embodiments, the opening 318 is formed by a plasma etch process, such as a plasma deep reactive ion etching (DRIE) process with organic gas as an etchant. For example, the plasma DRIE process may use inductively coupled plasma (ICP) having a power ranging from about 100 W to about 1500 W, a bias voltage ranging from about 0 V to about 300 V, and organic etchant such as $CH_3COOH$, $CH_3OH$, $CH_3CH_2OH$, or combinations thereof. In another example, the ICP plasma DRIE process may have a power ranging from about 100 W to about 1500 W, a bias voltage ranging from about 0 V to about 500 V, and etchant such as $CF_4$, $CHF_3$, $CH_3F$, $CH_2F_2$, $C_4F_8$, $C_4F_6$, $N_2$, $O_2$, Ar, or combinations thereof. In yet another example, the plasma DRIE process may have a power ranging from about 100 W to about 2000 W, a bias voltage ranging from about 0 V to about 500 V, and etchant such as $Cl_2$, $SiCl_4$, $BCl_3$, $CF_4$, $CHF_3$, $CH_2F_2$, $C_4F_8$, $C_4F_6$, $N_2$, $O_2$, Ar, or combinations thereof.

As shown in FIG. 4A, as a result of the etch process, the conductive layer 314 includes a bottom portion 320 and a via portion 322 extending upward from the bottom portion 320. The via portion 322 has a height H1, and the bottom portion 320 has a height H2. In some embodiments, the height H1 is substantially the same as the height H2. The via portion 322 has the top surface 316, and the bottom portion 320 has a top surface 324 that is not coplanar with the top surface 316, as shown in FIG. 4A. In some embodiments, multiple via portions 322 are formed extending upward from the bottom portion 320.

As shown in FIGS. 5A and 5B, a multilayer structure 326 is formed on the conductive layer 314. The multilayer structure 326 includes a bottom layer 328, a middle layer 330 disposed on the bottom layer 328, and a photoresist layer 332 disposed on the middle layer 330. In some embodiments, the multilayer structure 326 is a tri-layer photoresist. The bottom layer 328 and the middle layer 330 are made of different materials such that the optical properties and/or etching properties of the bottom layer 328 and the middle layer 330 are different from each other. In some embodiments, the bottom layer 328 may be an absorber layer, such as a chromium layer. The bottom layer 328 may be disposed in the opening 318 (FIG. 4A) and on the top surface 316. The middle layer 330 may be a silicon-rich layer designed to provide an etch selectivity between the middle layer 330 and the bottom layer 328. The photoresist layer 332 may be a chemically amplified photoresist layer and can be a positive tone photoresist or a negative tone photoresist. The photoresist layer 332 may include a polymer, such as phenol formaldehyde resin, a poly(norbornene)-co-malaic anhydride (COMA) polymer, a poly(4-hydroxystyrene) (PHS) polymer, a phenol-formaldehyde (hakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 332 may be formed by spin-on coating.

As shown in FIGS. 5A and 5B, the photoresist layer 332 is patterned. The patterning of the photoresist layer 332 may include exposing the photoresist layer 332 to an exposure light/beam through a photo mask (not shown). The exposure light/beam can be deep ultraviolet (DUV) light, such as KrF excimer laser light and ArF excimer laser light, extreme ultraviolet (EUV) light having a wavelength around 13.5 nm, an X-ray, and/or electron beam. In some embodiments, multiple exposure processes are performed. After the exposure process, a developing process is performed to form the patterned photoresist layer 332. As a result of the patterning process, openings are formed in the photoresist layer 332, and portions of the middle layer 330 are exposed.

As shown in FIGS. 6A and 6B, the pattern of the photoresist layer 332 is transferred to the middle layer 330 and the bottom layer 328. In some embodiments, the portions of the bottom layer 328 and middle layer 330 are removed by two etch processes for the openings to be transferred thereto.

Figures 7A, 7B:
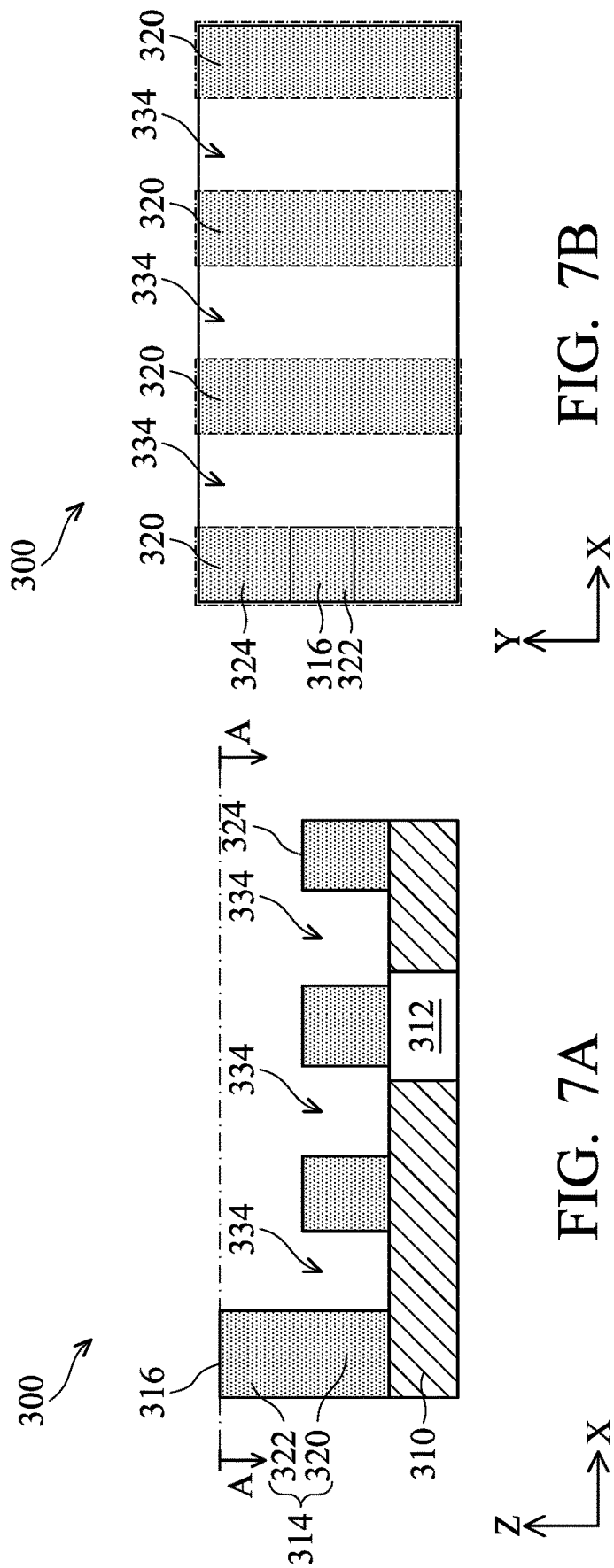

As shown in FIGS. 7A and 7B, the pattern of the photoresist layer 332 is transferred to the bottom portion 320 of the conductive layer 314, and the multilayer structure 326 are removed. The pattern of the photoresist layer 332 is transferred to the bottom portion 320 of the conductive layer 314 by removing portions of the bottom portion 320 of the conductive layer 314 to form openings 334. The openings 334 in the bottom portion 320 of the conductive layer 314 form a plurality of bottom portions 320 spaced apart from each other. In some embodiments, each bottom portion 320 is a conductive feature, such as a conductive line, and the via portion 322 extends upward from the bottom portion 320. As described above, multiple via portions 322 may extend upward from corresponding bottom portions 320. In some embodiments, the bottom portions 320 are the conductive features 304, and the via portions 322 are the conductive features 306 shown in FIG. 2. For example, the bottom portion may be a conductive line, and the via portion may be a conductive via. Because the bottom portions 320 and the via portions 322 are formed at the same time as part of the conductive layer 314, the grain size of the via portions 322 and the grain size of the bottom portions 320 may be substantially the same. As a result, electrical resistivity and RC delay are reduced. Furthermore, the via portions 322 are not formed by filling a via opening. Thus, the chance of having voids in the via portions 322 is substantially eliminated. In addition, because the bottom portion 320 and the via portion 322 extending upward therefrom are monolithic, the via portion 322 is self-aligned with the bottom portion 320. Lastly, the shape of the via portion 322 may be better controlled. For example, the shape of cross-section of the via portion 322 in the x-y plane (FIG. 7B) may be substantially square, which is larger than circular cross-section, leading to improved contact landing.

The portions the bottom portion 320 of the conductive layer 314 may be removed by any suitable method. In some embodiments, the etch process utilized to remove portions of the conductive layer 314 described in FIGS. 4A and 4B is used to remove portions of the bottom portion 320 of the conductive layer 314. FIG. 7B is a top view of the interconnect structure 300 of FIG. 7A, and the bottom portion 320 and the top surface 324 are shown in dotted lines, because the top surface 324 are located substantially below the top surface 316 of the via portion 322 along the z-axis. As shown in FIG. 7A, at least one of the bottom portions 320 of the conductive layer 314 is in contact with the conductive feature 312.

As shown in FIGS. 8A and 8B, a layer 336 is formed on the via portion 322, the bottom portions 320, and the exposed portions of the dielectric layer 310. The layer 336 includes a metal oxide or oxide doped carbide (ODC). In some embodiments, the layer 336 includes aluminum oxide. The layer 336 may be formed by any suitable method, such as ALD, CVD, or PVD. In some embodiments, the layer 336 is a conformal layer formed by ALD. Thus, the layer 336 is formed on the exposed surfaces of the interconnect structure 300. The layer 336 has a thickness ranging from about 10 Angstroms to about 30 Angstroms. The layer 336 may be a liner that protects the via portions 322 and the bottom portions 320 from being oxidized. In addition, the layer 336 prevents the atoms from the via portions 322 and the bottom portions 320 from diffusing into subsequently formed dielectric materials.

As shown in FIGS. 9A and 9B, a sacrificial layer 338 is formed on the layer 336. The sacrificial layer 338 fills the openings 334 (FIG. 8A) and is disposed over the top surface 316 of the via portion 322. The sacrificial layer 338 may include a polymer, such as an organic layer having C, O, N, and/or H. The sacrificial layer 338 may be formed by any suitable process, such as CVD, ALD, plasma enhanced CVD (PECVD), plasma enhanced ALD (PEALD), molecular layer deposition (MLD), or spin-on.

Figures 10A, 10B:
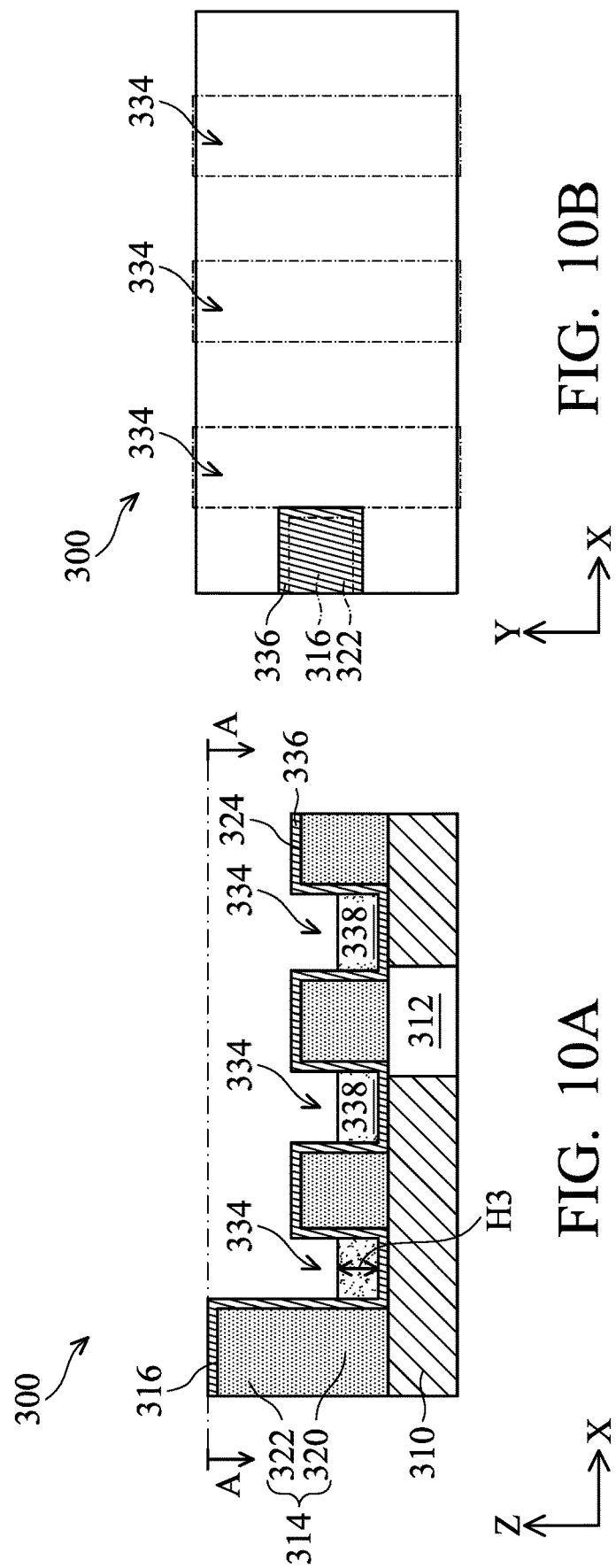

As shown in FIGS. 10A and 10B, the sacrificial layer 338 is recessed to a level at or below the level of the top surface 324 of the bottom portions 320 of the conductive layer 314. The recess of the sacrificial layer 338 may be performed by any suitable process, such as thermal baking, UV curing, an etch-back process (e.g., a plasma etch process), or any combination thereof. In some embodiments, the sacrificial layer 338 is first recessed to a level below the liner 336 disposed on the top surface 316 of the via portion 322 by a thermal process, followed by a UV curing process to further recess the sacrificial layer 338 to a level at or below the level of the top surface 324 of the bottom portions 320. The UV curing process may be utilized to control the height of the remaining sacrificial layer 338. In other words, the UV curing process may have better control of recessing the sacrificial layer 338 than the thermal process. The UV curing process exposes the sacrificial layer 338 to UV energy having an energy density ranging from about 10 mJ/cm$^2$ to about 100 J/cm$^2$. The recess of the sacrificial layer 338 by the UV curing process may partially open the openings 334, as shown in FIGS. 10A and 10B. In some embodiments, the recess of the sacrificial layer 338 may expose at least a portion of the layer 336 in the openings 334. The remaining sacrificial layer 338 may have a height H3 substantially equal to or less than the height H2 of the bottom portion 320 of the conductive layer 314. In some embodiments, the process to recess the sacrificial layer 338 does not substantially affect the layer 336. In some embodiments, the process to recess the sacrificial layer 338 removes portions of the layer 336. As a result, the layer 336 may include a first portion (exposed portion shown in FIG. 10A) having a first thickness and a second portion in contact with the recessed sacrificial layer 338 having a second thickness. The second thickness may be substantially greater than the first thickness.

As shown in FIGS. 11A and 11B, a dielectric material 342 is disposed on the layer 336 and the sacrificial layer 338. The dielectric material 342 fills the openings 334 and is disposed over the top surface 316 of the via portion 322 of the conductive layer 314. The dielectric material 342 may include the same material as the dielectric layer 310. In some embodiments, the dielectric material 342 includes a low-k dielectric material, such as SiOCH or porous silicon dioxide, and is formed by CVD, ALD, or spin coating.

As shown in FIGS. 12A and 12B, the sacrificial layer 338 is removed, forming an air gap 344 in each opening 334

(FIG. 10A) below the dielectric material 342. The removal of the sacrificial layer 338 may be a result of degradation or decomposition of the sacrificial layer 338. The decomposition or degradation of the sacrificial layer 338 may be performed by any suitable process, such as thermal baking and/or UV curing. In some embodiments, an UV curing process is performed to remove the sacrificial layer 338. The UV energy may pass through the porous dielectric material 342 to reach the sacrificial layer 338 and convert the sacrificial layer 338 into a gas. The gas is released from the openings 334 (FIG. 10A) through the dielectric material 342. The removal of sacrificial layer 338 does not substantially affect the other layers of the interconnect structure 300. For example, the UV curing process utilized to remove the sacrificial layer 338 does not substantially affect the dielectric material 342. The air gap 344 may have the height H4, which is the same as the height H3 of the sacrificial layer 338 shown in FIG. 10A. The air gap 344 may reduce capacitive coupling between neighboring bottom portions 320 of the conductive layer 314.

Figures 1, 13A:
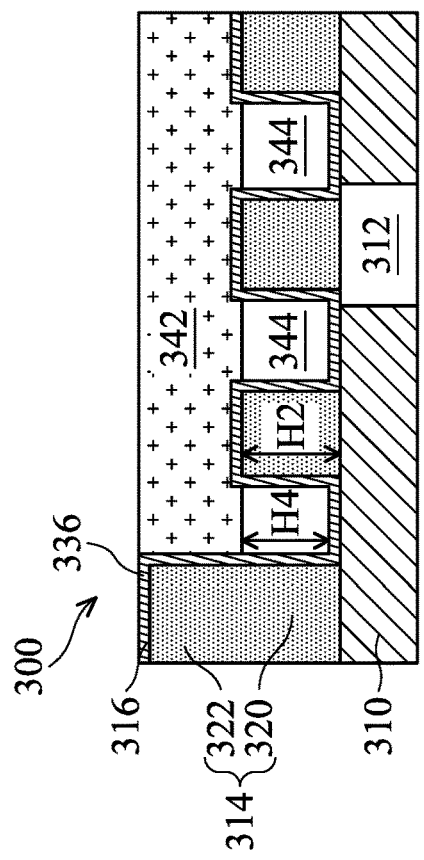
Figure 13B:
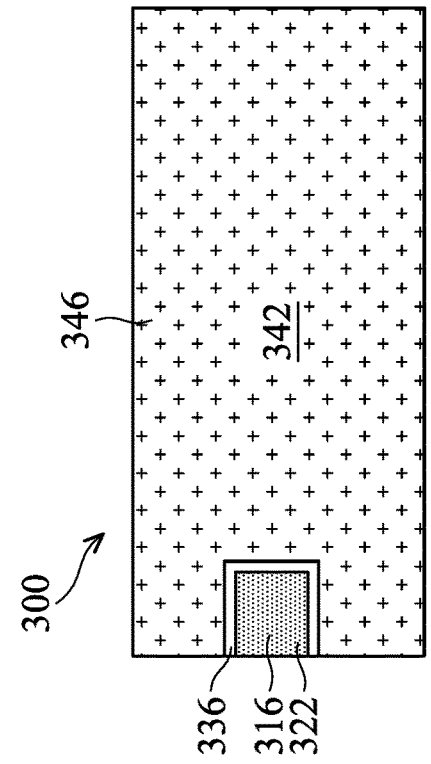
Figure 13A:
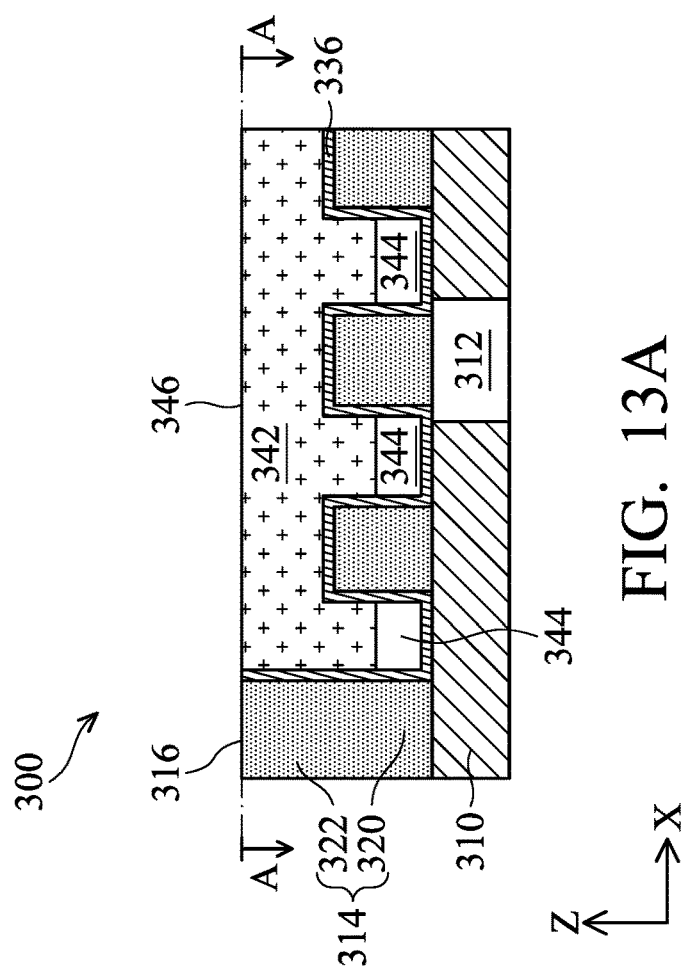

As shown in FIGS. 13A and 13B, a planarization process may be performed to remove a portion of the dielectric material 342 formed over the top surface 316 of the via portion 322 of the conductive layer 314. The portion of the layer 336 disposed on the top surface 316 of the via portion 322 may be also removed as a result of the planarization process. The planarization process may be any suitable process, such as a chemical-mechanical polishing (CMP) process. As a result of the planarization process, a top surface 346 of the dielectric material 342 may be substantially coplanar with the top surface 316 of the via portion 322. Because the planarization process stops when the top surface 316 of the via portion 322 is exposed, the chance of the materials introduced during the planarization process, such as slurry, entering the air gaps 344, which is located below the top surface 316 of the via portion 322, is substantially reduced. As a result, in some embodiments, the air gaps 344 may have the height H4 that is substantially the same as the height H2 of the bottom portions 320 of the conductive layer 314, as shown in FIG. 13A-1.

Figures 14A, 14B:
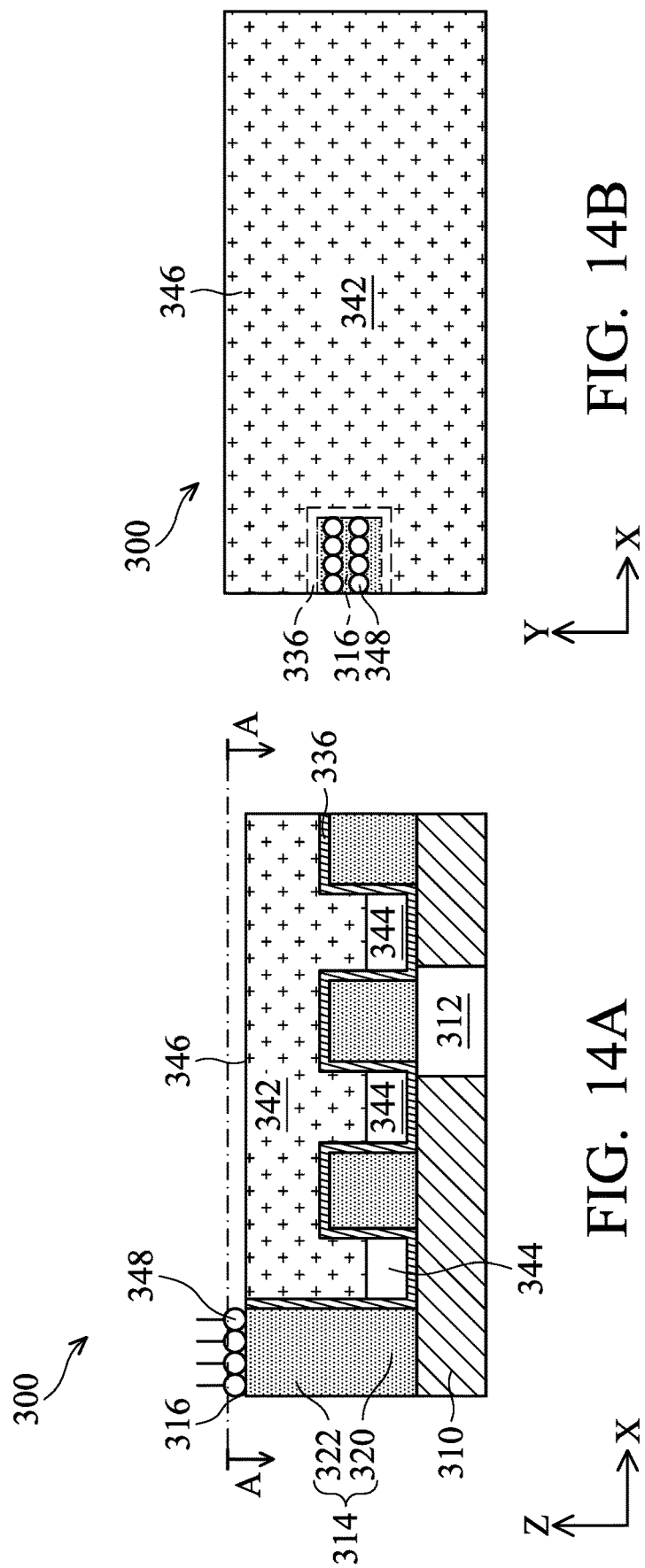

A treatment process may be performed to activate the metallic surfaces of the top surface 316 of the via portion 322 of the conductive layer 314. The treatment process may be a plasma treatment process utilizing process gases such as hydrogen gas, ammonia, and/or oxygen-containing gas. After the treatment process, a blocking layer 348 is selectively formed on the activated metallic top surface 316 of the via portion 322, as shown in FIGS. 14A and 14B. The blocking layer 348 may include a compound having a phosphorus (P), sulfur (S), silicon (Si), or nitrogen (N) end group to bond with the treated metallic surfaces. The blocking layer 348 is not formed on the dielectric surfaces of the dielectric material 342 and the layer 336. In some embodiments, the blocking layer 348 includes 1-octadecanethiol, 1-dodecanethiol, stearic acid, 4-dodecylbenzenesulfonic acid, dimethyl octadecylphosphonate, bi(dodecyl) dithiophosphinic acids, bi(octadecyl) dithiophosphinic acids, diethyl-n-octadecylphosphonate, octadecylphosphonic acid, decylphosphonic acid, tetradecylphosphonic acid, 2-mercaptobenzothiazole, 2-mercaptobenzoxazole, 2-mercaptobenzimidazole, benzothiazol, benzoxazole, benzimidazole, 2-methylbenzimidazole, 5,6-dimethylbenzimidazole, 2-(methylthio)benzimidazole, 1,2,3-triazole, 1,2,4-triazole, 3-amino-1,2,4-triazole, 1-hydroxybenzotriazole hydrate, 4-methyl-1H-benzotriazole, 5-methyl-1H-benzotriazole, 5,6-dimethyl-1H-benzotriazole, 4-hydroxy-1H-benzotriazole, benzotriazole-1-carboxamide, 2-methylbenzothiazole, imidazole, methimazole, 5-phenyl-1H-tetrazole, benzotriazole, 5-(3-aminophenyl)tetrazole, 4-amino-4H-1,2,4-triazole, 3-amino-5-mercapto-1,2,4-triazole, 3-amino-5-methylthio-1H-1,2,4-triazole, 2-aminopyrimidine, 2-mercaptopyrimidine, adenine, hypoxanthine, morpholine, 5-amino-1,3,4-thiadiazole-2-thiol, tryptophan, histidine, 5-(trifluoromethyl)-1H-1,2,3-benzotriazole, 1H-benzotriazole, 1-(4-morpholinylmethyl), phenothiazine, purine, melamine, trithiocyanuric acid, 1,3,4-thiadiazole-2,5-diamine, 3,5-diamino-1,2,4-triazole, 5-aminotetrazole, 3,6-bis(methylthio)-1,2,4,5-tetrazine, aminophylline, or other suitable compound. The blocking layer 348 may be formed by ALD, CVD, spin-on, dipping, or other suitable process. In some embodiments, the blocking layer 348 is selectively formed by MLD via gas phase precursors with specific functional groups attached to the activated top surface 316 but not the dielectric surface of the top surface 346.

As shown in FIGS. 15A and 15B, an etch stop layer 350 is selectively formed on the exposed top surface 346 of the dielectric material 342 and the exposed surfaces of the layer 336. The etch stop layer 350 may not be formed on the blocking layer 348. In other words, the blocking layer 348 blocks the etch stop layer 350 from forming on the metallic top surface 316 of the via portion 322. The blocking layer 348 blocks the precursor(s) of the etch stop layer 350 from forming thereon, so the precursor(s) of the etch stop layer 350 grows on the dielectric surfaces, such as the top surface 346 of the dielectric material 342 and the layer 336. The etch stop layer 350 may include an oxide or a nitride of a metal, such as Al, Ti, Zr, Hf, Y, or other suitable metal. The etch stop layer 350 may be formed by any suitable process, such as CVD, ALD, or spin-on. The etch stop layer 350 may have a thickness ranging from about 3 nm to about 5 nm.

As shown in FIGS. 16A and 16B, a dielectric material 352 is formed on the etch stop layer 350. In some embodiments, the dielectric material 352 is formed by a PECVD process, which simultaneously removes the blocking layer 348 (FIG. 15A). As a result, the dielectric material 352 is also formed on the top surface 316 of the via portion 322. The dielectric material 352 may include the same material as the dielectric material 342. In some embodiments, the dielectric material 352 includes a low-k dielectric material, such as SiOCH.

Figure 17B:
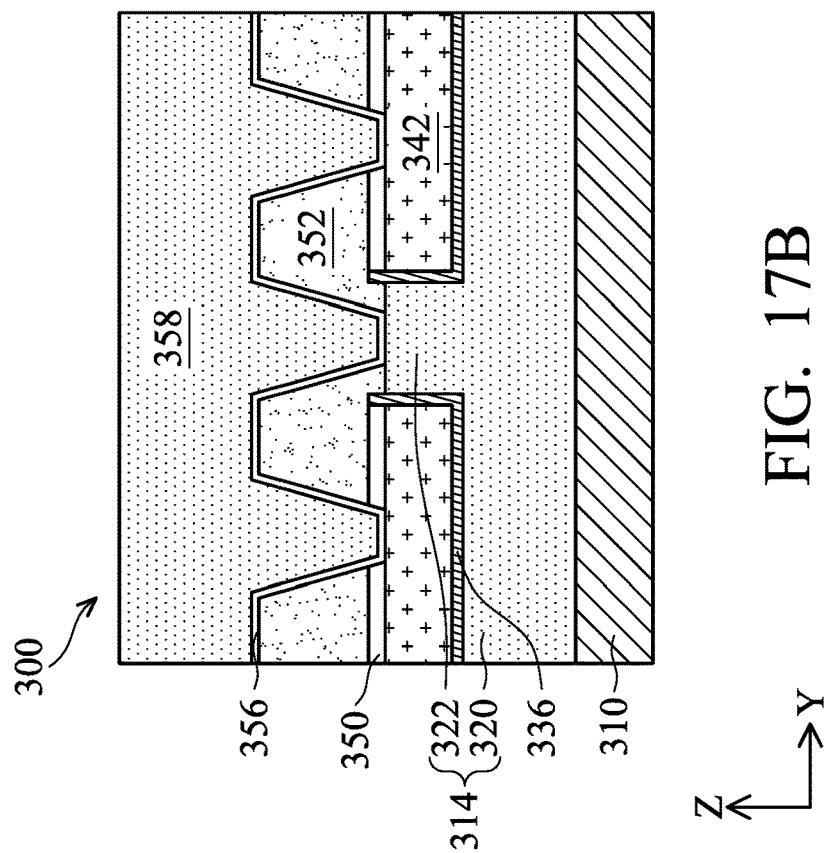
FIGS. 17A-17C are cross-sectional side views of various stages of manufacturing the interconnect structure along cross-section B-B shown in FIG. 16A, in accordance with some embodiments.
Figure 17A:
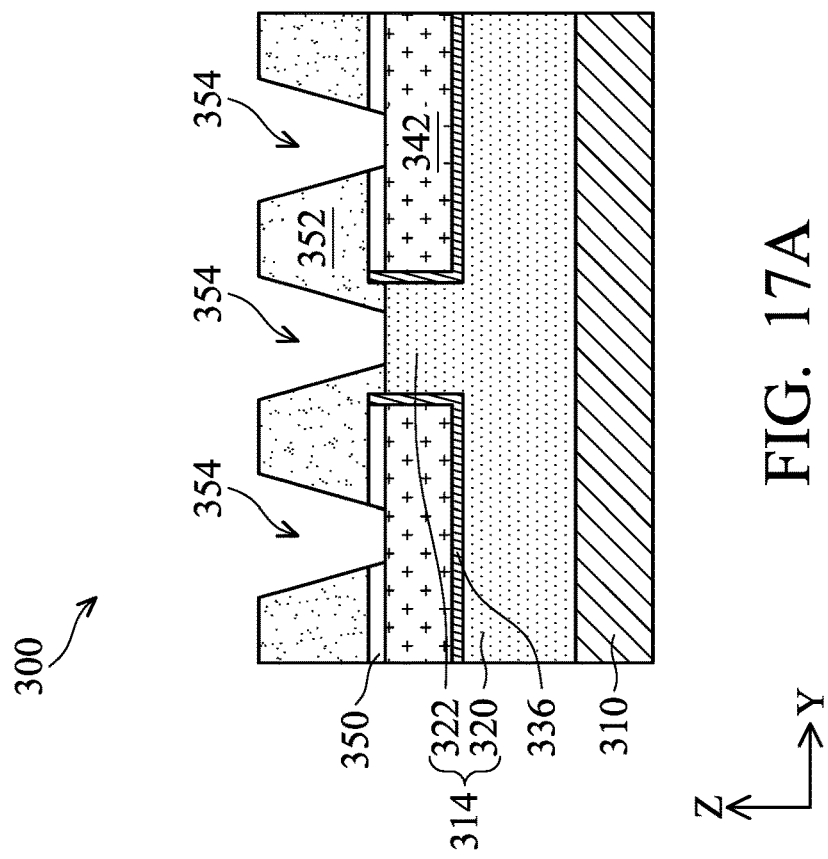
Figure 17C:
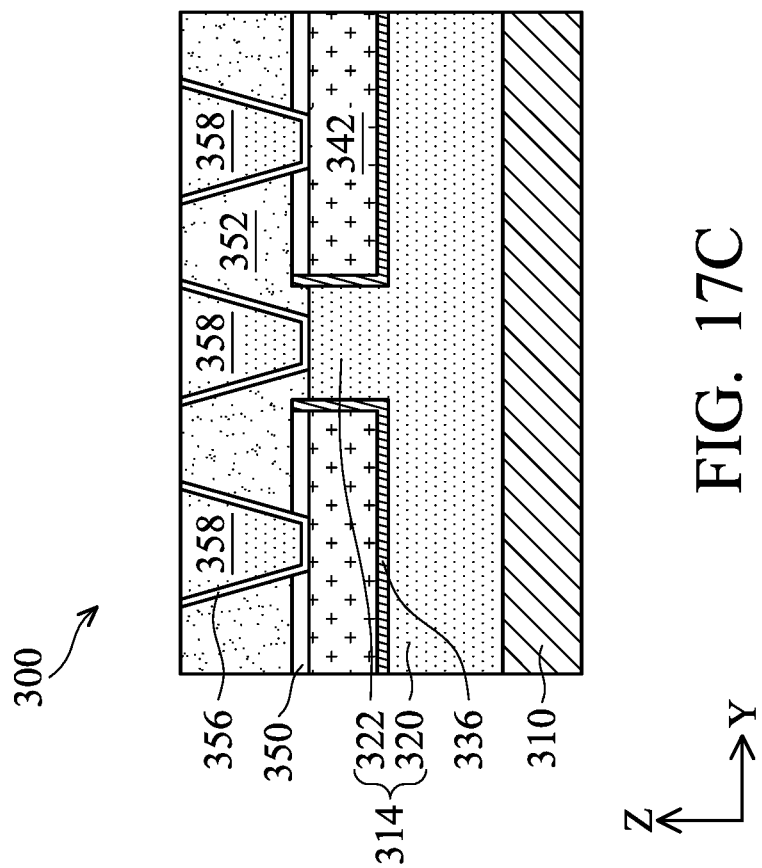

FIGS. 17A-17C are cross-sectional side views of various stages of manufacturing the interconnect structure 300 along cross-section B-B shown in FIG. 16A, in accordance with some embodiments. As shown in FIG. 17A, openings 354 are formed in the dielectric material 352 and the etch stop layer 350. The openings 354 may be formed by an etch process, such as a dry etch, wet etch, or a combination thereof. The openings 354 may be trenches, in some embodiments.

As shown in FIG. 17B, a barrier layer 356 is formed in the openings 354 and on the dielectric material 352, the etch stop layer 350, the dielectric material 342, and the via portion 322. The barrier layer 356 may include a nitride, such as tantalum nitride or titanium nitride, and may be formed by a conformal process, such as ALD. A conductive material 358 is formed on the barrier layer 356. The conductive material 358 may include the same material as the conductive layer 314. In some embodiments, the conductive material 358 includes copper. In some embodiments, the conductive material 358 includes a metal that is not susceptible to diffusion, such as cobalt, and the barrier layer 356 is not present.

As shown in FIG. 17C, a planarization process, such as a CMP process, is performed to expose the dielectric material 352. The portions of the conductive material 358 formed in the openings 354 (FIG. 17A) may be conductive lines. In some embodiments, the portions of the conductive material 358 formed in the openings 354 (FIG. 17A) are the conductive features 304 shown in FIG. 3.

Figure 18B:
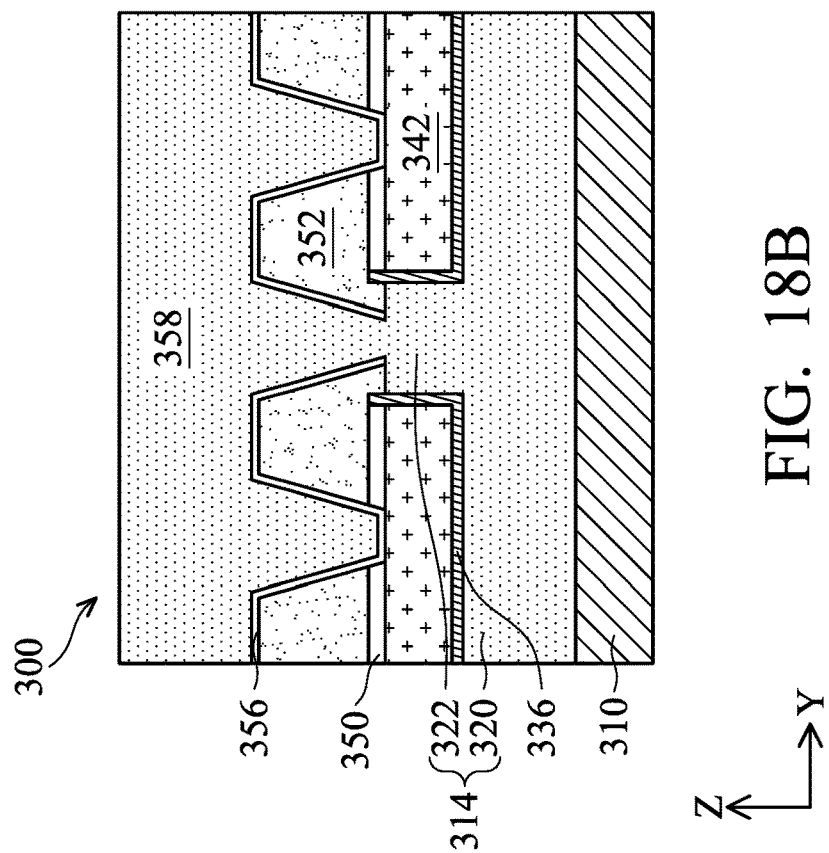
FIGS. 18A-18C are cross-sectional side views of various stages of manufacturing the interconnect structure along cross-section B-B shown in FIG. 16A, in accordance with alternative embodiments.
Figure 18A:
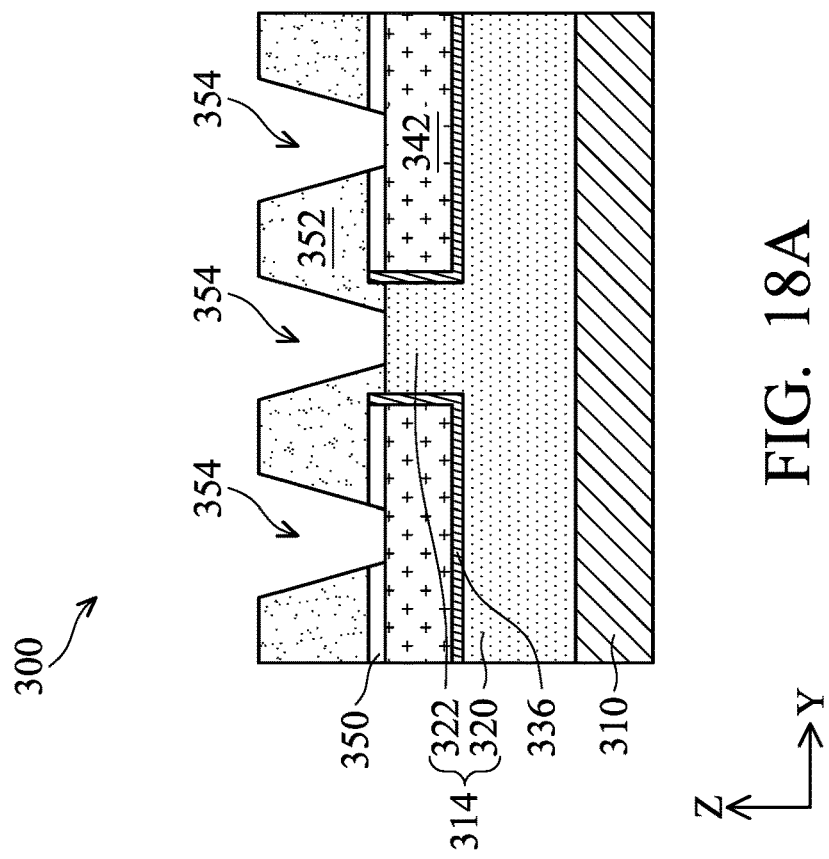
Figure 18C:
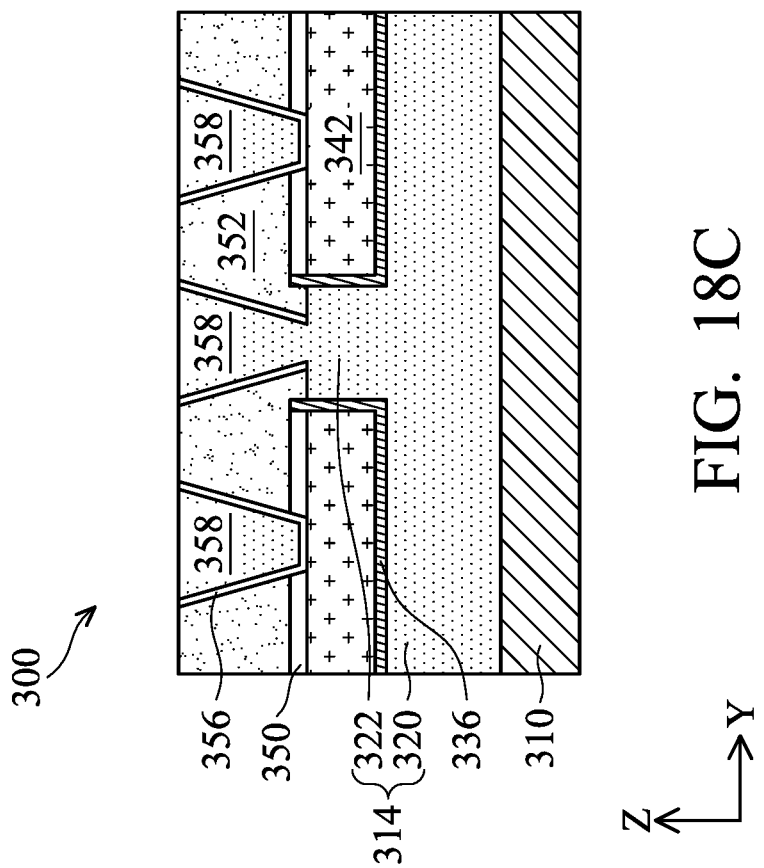

FIGS. 18A-18C are cross-sectional side views of various stages of manufacturing the interconnect structure 300 along cross-section B-B shown in FIG. 16A, in accordance with alternative embodiments. As shown in FIG. 18A, openings 354 are formed in the dielectric material 352 and the etch stop layer 350. The openings 354 may be formed by an etch process, such as a dry etch, wet etch, or a combination thereof. The openings 354 may be trenches, in some embodiments.

As shown in FIG. 18B, the barrier layer 356 is selectively formed on the dielectric material 352, the etch stop layer 350, and the dielectric material 342. The barrier layer 356 is not formed on the via portion 322. A blocking layer (not shown), such as the blocking layer 348 (FIG. 14A), may be first selectively formed on the via portion 322 before the deposition of the barrier layer 356. Then, the barrier layer 356 is selectively formed on the dielectric materials of the dielectric material 352, the etch stop layer 350, and the dielectric material 342. The blocking layer formed on the via portion 322 blocks the precursors of the barrier layer 356 from forming on the via portions 322. Next, the blocking layer is removed by a plasma process. The conductive material 358 is then formed on the barrier layer 356 and on the via portion 322. The direct contact between the conductive material 358 and the via portion 322 further reduces electrical resistivity.

As shown in FIG. 18C, a planarization process, such as a CMP process, is performed to expose the dielectric material 352. The portions of the conductive material 358 formed in the openings 354 (FIG. 18A) may be conductive lines. In some embodiments, the portions of the conductive material 358 formed in the openings 354 (FIG. 18A) are the conductive features 304 shown in FIG. 3.

The present disclosure in various embodiments provides a method to form conductive features in a dielectric layer. The method may be dual damascene process that forms a conductive via extending upward from a conductive line. In some embodiments, the method includes forming a conductive layer 314, removing portions of the conductive layer 314 to form bottom portions 320 and via portion 322. Some embodiments may achieve advantages. For example, because the bottom portions 320 and the via portions 322 are formed at the same time as part of the conductive layer 314, electrical resistivity and RC delay are reduced.

An embodiment is a method. The method includes forming a conductive layer, removing portions of the conductive layer to form a via portion extending upward from a bottom portion, forming a sacrificial layer over the via portion and the bottom portion, recessing the sacrificial layer to a level substantially the same or below a level of a top surface of the bottom portion, forming a first dielectric material over the via portion, the bottom portion, and the sacrificial layer, and removing the sacrificial layer to form an air gap adjacent the bottom portion.

Another embodiment is a method. The method includes forming a conductive layer, removing a first portion of the conductive layer to form a via portion, and removing second portions of the conductive layer to form a plurality of bottom portions. The via portion extends upward from one of the plurality of bottom portions. The method further includes forming a sacrificial layer over the via portion, over the bottom portions, and between adjacent bottom portions, forming a first dielectric material over the via portion, the bottom portion, and the sacrificial layer, removing the sacrificial layer to form air gaps between adjacent bottom portions, forming a blocking layer on the via portion, selectively forming an etch stop layer on the first dielectric material, and forming a second dielectric material on the via portion and the etch stop layer.

A further embodiment is a interconnect structure. The structure includes a plurality of conductive lines disposed over a dielectric layer. Air gaps are located between adjacent conductive lines, and each air gap has a height substantially the same as a height of each conductive line. The structure further includes a conductive via extending upward from one of the plurality of conductive lines, and the one conductive line and the conductive via are monolithic and have substantially the same grain size. The structure further includes a first dielectric material disposed over the plurality of conductive lines, and the first dielectric material surrounds the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
forming a conductive layer;
removing portions of the conductive layer to form a via portion extending upward from a bottom portion;
forming a sacrificial layer over the via portion and the bottom portion;
recessing the sacrificial layer to a level substantially the same or below a level of a top surface of the bottom portion;
forming a first dielectric material over the via portion, the bottom portion, and the sacrificial layer; and
removing the sacrificial layer to form an air gap adjacent the bottom portion.

2. The method of claim 1, wherein the via portion is formed before forming the bottom portion.

3. The method of claim 1, further comprising forming a layer on the via portion and the bottom portion prior to forming the sacrificial layer.

4. The method of claim 3, further comprising performing a planarization process to expose a top surface of the via portion after forming the first dielectric material.

5. The method of claim 4, further comprising forming a second dielectric material over the first dielectric material.

6. The method of claim 5, further comprising forming an opening in the second dielectric material.

7. The method of claim 6, further comprising forming a conductive material in the opening, wherein the conductive material is disposed over the via portion.

8. A method, comprising:
forming a conductive layer;
removing a first portion of the conductive layer to form a via portion;

removing second portions of the conductive layer to form a plurality of bottom portions, wherein the via portion extends upward from one of the plurality of bottom portions;

forming a sacrificial layer over the via portion and the bottom portions, wherein the sacrificial layer is formed between adjacent bottom portions;

forming a first dielectric material over the via portion, the bottom portions, and the sacrificial layer;

removing the sacrificial layer to form air gaps between adjacent bottom portions;

forming a blocking layer on the via portion;

selectively forming an etch stop layer on the first dielectric material; and forming a second dielectric material on the via portion and the etch stop layer.

9. The method of claim 8, further comprising recessing the sacrificial layer to a level substantially the same or below a level of a top surface of one of the plurality of bottom portions before forming the first dielectric material.

10. The method of claim 9, wherein the removing the sacrificial layer to form the air gaps comprises performing an ultraviolet curing process.

11. The method of claim 9, further comprising forming a plurality of openings in the second dielectric material, wherein the via portion is exposed in one of the plurality of openings.

12. The method of claim 11, further comprising forming a barrier layer on the second dielectric material and the exposed via portion.

13. The method of claim 11, further comprising selectively forming a barrier layer on the second dielectric material.

14. The method of claim 13, further comprising forming a conductive material on the barrier layer and the via portion.

15. A method, comprising:
depositing a conductive layer;
forming a conductive via from the conductive layer;
forming a plurality of conductive lines from the conductive layer, wherein the conductive via and one of plurality of conductive lines are monolithic;
depositing a first dielectric material over the conductive via and the plurality of conductive lines;
depositing a second dielectric material over the first dielectric material;
selectively depositing an etch stop layer on the first dielectric material, wherein the second dielectric material is deposited on the etch stop layer, and the second dielectric material is in contact with the conductive via; and
forming one or more conductive features in the second dielectric material.

16. The method of claim 15, further comprising performing a planarization process on the first dielectric material, wherein a top surface of the conductive via is substantially coplanar with a top surface of the first dielectric material.

17. The method of claim 15, wherein forming the one or more conductive features in the second dielectric material comprises forming a plurality of conductive features in the second dielectric material.

18. The method of claim 17, further comprising forming a plurality of openings in the second dielectric material to expose portions of the first dielectric material and the conductive via.

19. The method of claim 18, further comprising selectively depositing a barrier layer in the plurality of openings in the second dielectric material, wherein the barrier layer is selectively deposited on the first and second dielectric materials.

20. The method of claim 18, further comprising depositing a barrier layer in the plurality of openings in the second dielectric material, wherein the barrier layer is deposited on the first and second dielectric materials and on the conductive via.

* * * * *